US008903696B2

(12) United States Patent
Motel et al.

(10) Patent No.: US 8,903,696 B2
(45) Date of Patent: Dec. 2, 2014

(54) SYSTEM AND METHOD FOR CONTROLLING GRANULARITY OF TRANSACTION RECORDING IN DISCRETE EVENT SIMULATION

(75) Inventors: Vincent Motel, Grenoble (FR); Neeti Bhatnagar, San Jose, CA (US); George F. Frazier, Lawrence, KS (US); William W. LaRue, Jr., Leawood, KS (US)

(73) Assignee: Cadence Design Systems, Inc., San Jose, CA (US)

( * ) Notice: Subject to any disclaimer, the term of this patent is extended or adjusted under 35 U.S.C. 154(b) by 617 days.

(21) Appl. No.: 13/183,790

(22) Filed: Jul. 15, 2011

(65) Prior Publication Data
US 2013/0018644 A1 Jan. 17, 2013

(51) Int. Cl.
*G06F 17/50* (2006.01)

(52) U.S. Cl.
CPC ........ *G06F 17/5022* (2013.01); *G06F 17/5009* (2013.01); *G06F 17/50* (2013.01)
USPC .......... 703/14; 703/16; 703/17; 714/E11.197; 716/106

(58) Field of Classification Search
None
See application file for complete search history.

(56) References Cited

U.S. PATENT DOCUMENTS

| | | | |
|---|---|---|---|
| 5,701,439 A * | 12/1997 | James et al. | 703/17 |
| 5,850,538 A * | 12/1998 | Steinman | 703/21 |
| 6,077,304 A * | 6/2000 | Kasuya | 703/14 |
| 6,324,495 B1 * | 11/2001 | Steinman | 703/17 |
| 6,961,689 B1 * | 11/2005 | Greenberg | 703/17 |
| 7,460,988 B2 * | 12/2008 | Higashi | 703/13 |
| 7,774,440 B1 * | 8/2010 | Bagrodia et al. | 709/221 |
| 8,036,874 B2 * | 10/2011 | Igarashi | 703/22 |
| 8,170,847 B2 * | 5/2012 | Jain et al. | 703/6 |
| 8,224,636 B2 * | 7/2012 | Kundert | 703/14 |
| 8,296,119 B2 * | 10/2012 | Larue et al. | 703/14 |
| 8,417,504 B2 * | 4/2013 | Veller et al. | 703/14 |
| 8,538,848 B1 * | 9/2013 | Myhrvold et al. | 705/36 R |
| 8,621,070 B1 * | 12/2013 | Venneti et al. | 709/224 |
| 8,775,149 B2 * | 7/2014 | Kundert | 703/14 |
| 2002/0133325 A1 * | 9/2002 | Hoare et al. | 703/17 |
| 2004/0243375 A1 * | 12/2004 | Kundert | 703/14 |
| 2005/0216248 A1 * | 9/2005 | Ciolfi et al. | 703/22 |
| 2006/0036426 A1 * | 2/2006 | Barr et al. | 703/22 |
| 2006/0195825 A1 * | 8/2006 | Vanspauwen et al. | 717/135 |
| 2007/0168893 A1 * | 7/2007 | Watanabe et al. | 716/3 |
| 2007/0288201 A1 * | 12/2007 | Kato et al. | 702/182 |

(Continued)

OTHER PUBLICATIONS

"OSCI TLM-2.0 Langauge Reference Manual" software version TLM 2.0.1, pp. 1-194, Jul. 2009.*

(Continued)

*Primary Examiner* — Omar Fernandez Rivas
*Assistant Examiner* — Kibrom K Gebresilassie
(74) *Attorney, Agent, or Firm* — Dickstein Shapiro LLP (57) ABSTRACT

A method and system for controlling granularity of transaction recording and visualizing system performance and behavior in a discrete functional verification software simulation environment is disclosed. According to one embodiment, a simulation of a model is run in a discrete event simulation system for a period of time. During the simulation, statistical values of attribute for a plurality of transactions occurring during the period of time are monitored. Based on a granularity setting, a group of consecutive transactions is grouped into a super transaction, and the statistical values representing the super transaction are recorded to represent the group of transactions. The super transactions are visualized in a visualization tool for analyzing the performance of the model.

25 Claims, 2 Drawing Sheets

(56) References Cited

U.S. PATENT DOCUMENTS

| | | | |
|---|---|---|---|
| 2009/0006068 A1* | 1/2009 | Igarashi | 703/16 |
| 2009/0119310 A1* | 5/2009 | Larue et al. | 707/100 |
| 2009/0235254 A1* | 9/2009 | Michael | 718/101 |
| 2010/0318342 A1* | 12/2010 | Tamiya | 703/14 |
| 2011/0184713 A1* | 7/2011 | Yang | 703/13 |
| 2011/0307847 A1* | 12/2011 | Liao et al. | 716/103 |
| 2012/0005640 A1* | 1/2012 | Mehta | 716/106 |
| 2012/0017197 A1* | 1/2012 | Mehta | 717/104 |
| 2013/0074019 A1* | 3/2013 | Mehta | 716/106 |

OTHER PUBLICATIONS

J. Lucas, M. Saccucci, "Exponentially Weighted Moving Average Control Schemes: Properties and Enhancements" pp. 1-12, 1990.*

"OSCI TLM 2.0 Language Reference Manual", Jul. 2009, pp. 1-194.*

E. Copty, G. Kamhi, S. Novakovshy, "Transaction Level Statistical Analysis for Efficient Micro-Architectural Power and Performance Studies", pp. 351-356, Jun. 2011.*

An Insider's View on the Making of the New TLM-2.0 Standard; B.Vanthournout, Jun. 2008.

Architectural Analysis at Transaction Level with C++ TxE; V. Motel, A.Cuccaro, A.Perrin, J.Thevenon Presentation given May 20, 2009.

Real-Time Statistical Clustering for Event Trace Reduction; Oleg Y Nickolayev, et al; International Journal of Super Computer Applications and High Performance Computing, vol. 11, No. 2, Summer 1997, pp. 144-159.

Variation-Aware System-Level Power Analysis; Saumya Chandra et al; IEEE, vol. 18, No. 8, Aug. 2010, pp. 1173-1184.

Transaction Level Statistical Analysis for Efficient Micro-Architectural Power and Performance Studies; Eman Copty et al; pp. 351-356.

Application No. 12176331.2 International Search Report; Dec. 19, 2012.

* cited by examiner

SYSTEM AND METHOD FOR CONTROLLING GRANULARITY OF TRANSACTION RECORDING IN DISCRETE EVENT SIMULATION

FIELD

The field of the invention relates generally to functional verification of a user's circuit using software simulation and analyzing system performance and behavior during the simulation, and more particularly relates to a method and system for controlling granularity of transaction recording and visualizing system performance in a discrete simulation environment.

BACKGROUND

A discrete event simulation can generate millions or hundreds of millions of individual transactions in a simulation system. If the system attempts to record all of these transactions for post processing later, millions or hundreds of millions of transactions must be recorded to a transaction database. Recording each of these transactions provides a complete snapshot of system activity in a design, but there are severe problems associated with recording such a large data set, e.g., memory capacity, data manageability, tractability, searchability, and visualization, etc.

Several approaches have been made to efficiently record, track, and search, and visualize large amount of transaction data. One approach is to record for only certain amounts of time, short bursts of recording during interesting time intervals. However, this approach does not capture all of the transaction data during simulation so data of a particular interest may be missed, especially if transaction data are recorded as an exploratory activity.

Another approach is to record the transaction data in an efficient binary data format. However, even with an efficient storage, the amount of data being recorded is still too large to make difficult management, search, and visualization of the data for post processing.

None of these approaches makes efficient storage and usage of the transaction-level data as they record a complete history of transaction data in a discrete event simulation.

The present invention provides benefits and solutions in compacting transaction records and controlling granularity of transaction recording for facilitating visualization of system performance or behavior in a discrete simulation environment.

SUMMARY

A method and system for controlling granularity of transaction recording and visualizing system performance in a discrete functional verification software simulation environment is disclosed. According to one embodiment, a simulation of a model is run in a discrete event simulation system for a period of time. During the simulation, statistical values of attribute for a plurality of transactions occurring during the period of time are monitored. Based on a granularity setting, a group of consecutive transactions is grouped into a super transaction, and the statistical values representing the super transaction are recorded to represent the group of transactions. The super transactions are visualized in a visualization tool for analyzing the performance of the model.

The above and other preferred features described herein, including various novel details of implementation and combination of elements, will now be more particularly described with reference to the accompanying drawings and pointed out in the claims. It will be understood that the particular methods and circuits are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The accompanying drawings, which are included as part of the present specification, illustrate the presently preferred embodiment of the present invention and together with the general description given above and the detailed description of the preferred embodiment given below serve to explain and teach the principles of the present invention.

It should be noted that the figures are not necessarily drawn to scale and that elements of similar structures or functions are generally represented by like reference numerals for illustrative purposes throughout the figures. It also should be noted that the figures are only intended to facilitate the description of the various embodiments described herein. The figures do not describe every aspect of the teachings disclosed herein and do not limit the scope of the claims.

DETAILED DESCRIPTION

A method and system for controlling granularity of transaction recording and visualizing system performance and behavior in a discrete functional verification software simulation environment is disclosed. According to one embodiment, a simulation of a model is run in a discrete event simulation system for a period of time. During the simulation, statistical values of attribute for a plurality of transactions occurring during the period of time are monitored. Based on a granularity setting, a group of consecutive transactions is grouped into a super transaction, and the statistical values representing the super transaction are recorded to represent the group of transactions. The super transactions are visualized in a visualization tool for analyzing the performance of the model.

Each of the features and teachings disclosed herein can be utilized separately or in conjunction with other features and teachings to provide a method for reducing the order of system models exploiting sparsity. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the present invention. However, it will be apparent to one skilled in the art that these specific details are not required to practice the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk, including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms presented herein are not inherently related to any particular computer or other apparatus. Various general purpose systems, design verification systems such as a hardware emulator, simulator, and hardware-accelerated simulator systems, or testers providing scan inputs to such design verification systems may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the teachings of the invention as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

Open SystemC™ Initiative (OSCI) defines standards for system-level design. SystemC transaction-level modeling (TLM) Specification 2.0 is an example of a Discrete Event Simulation (DES) where modules representing components of a simulation system communicate via function calls that pass parameters with a fixed open structure through the system. These functions are also referred to as transport functions. Note that the various embodiments described herein are described with reference to TLM Specification 2.0, however it is not intended to be limited to any particular version of the TLM Specification.

Transport functions are called by various modules in the system including initiators, targets, and interconnect modules (an interconnect module can be an initiator or a target). Semantically, transport functions represent reads and writes between TLM modules. In TLM 2.0 Specification, transport functions include b_transport, nb_transport_bw, and nb_transport_fw; b_transport is a blocking transport call; nb_transport_fw is a forward non-blocking transport call; and nb_transport_bw is a backward non-blocking transport call. For a read or write to be complete, a chain of hops from an initiator to a target must complete. b_transport represents a complete read or write between an initiator and a target, but depending on the modeling style, nb_transport_fw may be a portion of a complete read or write operation. In this case, an nb_transport_bw call from the target module back to the initiator module indicates that the read or write operation has ended. TLM 2.0 Specification provides details of communication protocols and their sequences of transport calls to define a sequence and completion of a read or write transaction.

The present technique for grouping and collapsing transaction calls and/or hops in a generic transaction call is not limited to known transaction-level modeling such as TLM 2.0 Specification, but is generally applicable to any discrete event simulation that takes place on a system design including modules that communicate with function calls, and to any lower level simulation whose detailed activity can be abstracted into elementary transactions. In the case of TLM 2.0 Specification, the function calls, b_transport, nb_transport_fw, and nb_transport_bw pass parameters with a fixed open structure in a data type/format called "generic payload." It is noted that various embodiments and examples herein are described in the context of TLM 2.0 design environment for the purpose of facilitating explanation of the underlying principle, however they are applicable to any discrete event simulation environment without deviating the spirit and scope of the present subject matter.

As an example of a fixed open data type representing information important for modeling electronic systems, Table 1 lists the fields of generic payload data structure of TLM 2.0 specification:

TABLE 1

Generic Payload of OSCI SystemC TLM

| | |
|---|---|
| m_command | Type of transaction. Three values are supported: TLM_WRITE_COMMAND TLM_READ_COMMAND TLM_IGNORE_COMMAND |
| m_address | Transaction base address (byte addressing). |
| m_data | When m_command = TLM_WRITE_COMMAND |

TABLE 1-continued

Generic Payload of OSCI SystemC TLM

| | |
|---|---|
| | contains a pointer to the data to be written in the target. When m_command = TLM_READ_COMMAND contains a pointer where to copy the data read from the target. |
| m_length | Total number of bytes of the transaction |
| m_response_status | Indicates whether an error has occurred during the transaction. Values are: TLM_OK_RESP TLM_INCOMPLETE_RESP TLM_GENERIC_ERROR_RESP TLM_ADDRESS_ERROR_RESP TLM_COMMAND_ERROR_RESP TLM_BURST_ERROR_RESP TLM_BYTE_ENABLE_ERROR_RESP |
| m_byte_enable | Used to create burst transfers where the address increment between each beat is greater than the word length of each beat, or to place words in selected byte lanes of a bus. |
| m_byte_enable_length | For a read or a write command, the target interprets the byte enable length attribute as the number of elements in the bytes enable array. |
| m_streaming_width | Width of streaming data pulse |

Figure 1:
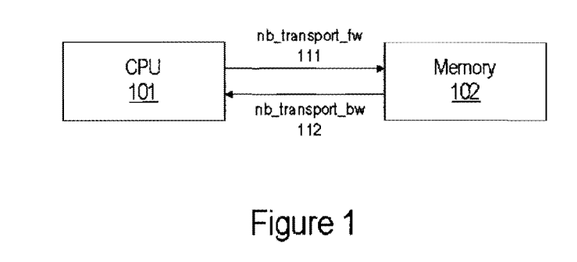
FIG. 1 illustrates an exemplary simulation system, according to one embodiment.

FIG. 1 illustrates an exemplary simulation system, according to one embodiment. System 100 has a CPU 101 and a memory 102. CPU 101 is a TLM initiator, and memory 102 is a TLM target. These modules communicate via at least a forward direction call and optionally a backward direction call by passing generic payload objects as parameters. In this example, a read or write operation takes both forward and backward calls: an nb_transport_fw call 111 from CPU 101 to memory 102 and an nb_transport_bw call 112 from memory 102 to CPU 101.

Figure 2:
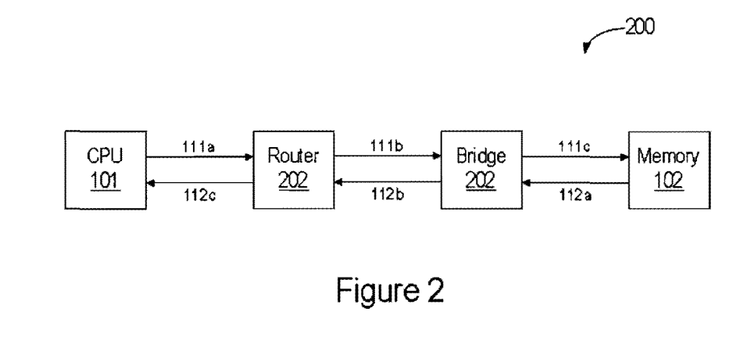
FIG. 2 illustrates an exemplary simulation system with multiple hops, according to one embodiment.

FIG. 2 illustrates an exemplary simulation system with multiple hops, according to one embodiment. System 200 represents a design with a finer level of granularity providing a higher level of precision in simulation. Compared to system 100 that only represents only a gross level of precision between CPU 101 and memory 102, system 200 contains function calls between interconnect modules including a router 202 and a bridge 203. In system 200, the top level function call between CPU 101 and memory 102 is performed with multiple hops including interior calls of nb_transport_fw 111a, 111b, and 111c and nb_transport_bw 112a, 112b, and 112c between the interconnect modules.

In a discrete event simulation environment, a simulator simulates a user design as a specified computer program written in a programming language such as SystemC™. The simulator may be augmented by an external tool to facilitate debugging and analyzing system performance during a simulation. The system behavior and performance are analyzed to determine if the system design functions correctly and meets acceptable levels of performance by examining statistical values obtained during the analysis. Throughput, utilization, or minimum, maximum, mean latency of system modules, and/or any other system performance metric are used for the system performance analysis.

For analyzing system performance, transaction information is captured with meta-data in each transport call during a simulation and recorded to a file or database of an external system. The captured transaction information represents a snapshot of the system performance and module behavior during the simulation. The data corresponding to a transport call is typically the value of parameters passed by the transport call, for example, the value of generic payload objects in the case of TLM 2.0. Other meta-data such as the time of a transport call and the latency between the start and finish times in a transport call may also be recorded and analyzed. If the data type of transaction information is fixed and known such as generic payload of TLM 2.0 Specification, an external tool can capture all of this information without explicitly calling out the data type in the computer program.

A typical TLM simulation generates millions or hundreds of millions of individual transport calls, and similar orders of transaction counts in a transaction recording session. That set of transactions provides a snapshot of system activity during a simulation, and is valuable for system debugging or system performance analysis.

Recording each and every transaction record is undesirable for the following reasons:

1) Even with a compressed, application-specific data format, the amount of data to be recorded too big and difficult to manipulate;
2) Visualizing transactions in an external visualization tool can be very difficult and provides little insight into the design and system performance if too many transactions are displayed;
3) Writing such a huge amount of transaction data to a storage medium significantly slows the simulation; and
4) Large sequences of transaction hold limited informational content, for example, N write transactions of the same data to incrementing addresses.

According to one embodiment, user selects granularity, i.e., a level of accuracy, for transaction recording. Instead of recording each and every bit of information about data passed in each transaction call, transaction data is selectively recorded.

A hop refers to a call from one module to another. Several hops may be required to complete an individual transaction call such as a read or write. Statistical values, such as an average or a standard deviation, computed on the attributes of the individual hops and/or transaction calls are used for a super transaction.

In one embodiment, one or more hops are collapsed into a larger transaction, herein referred to as "super transaction." To collapse multiple hops into a single super transaction, certain information is summarized to statistically represent the multiple hops in a single super transaction while maintaining the statistical information of the entire transaction.

For example, user selects minimum granularity 0 for the least amount of accuracy and maximum granularity 10 for the greatest amount of accuracy, indicating no data collapse. As the granularity of transaction recording increases (slides) from minimum to maximum value, the accuracy of recording gradually increases.

In one embodiment, the number of average bytes for multiple hops having different bytes is used. For example, if the first hop writes 3 bytes, and the second hop writes 1 byte, the mean value of 2 bytes is recorded for the super transaction. There are various ways to group multiple hops or transaction calls to form a super transaction, by automatically detecting changes or events. The detailed transactional information may be lost, but a super transaction record contains a statistical summary of the collapsed transaction.

With an appropriate selection of granularity, a moderate and manageable amount of data is recorded. An added benefit is that the time period of a simulation can be further extended for analysis. For example, if data only for 200 ms can be recorded with no data compaction, up to 1 second of data can be recorded with 5 times data compaction. With a longer the time of simulation, the system can be analyzed faster, shortening the time for development of the design.

The present technique for generating super transactions provides a novel approach of summarizing data for groups of transaction calls in a discrete event simulation. In one embodiment, super transactions are recorded in a discrete event simulation maintaining the format of conventional transactions such that the system performance can be analyzed with existing analysis tools. The existing analysis tools, for example, provide an automatic analysis and visualization for gaining a statistical analysis of a simulation over and beyond just saving storage space for recording transaction information.

According to one embodiment, transaction data in a simulation is collapsed on a sliding granularity scale from maximum to minimum value. In one embodiment, for maximum granularity 10, all data including data for each and every hop in a transaction call is recorded. For granularity 5, the interior hops are collapsed, and a single recorded transaction is recorded in each transaction call.

For granularity greater than 5 but smaller than 10, certain "windows" of hops are summarized. For example, a transaction call containing 10 hops are collapsed into 8 super transactions as follows:

TABLE 2

| Super transaction | Hops |
|---|---|
| 1 | 0, 1 |
| 2 | 2, 3 |
| 3 | 4, 5 |
| 4 | 6 |
| 5 | 7 |
| 6 | 8 |
| 7 | 9 |
| 8 | 10 |

For granularities smaller than 5 but greater than 0, one or more transaction calls are grouped and recorded in a ever bigger super transaction compared to granularity set between 5 and 10, using a statistical method to gather relevant transaction calls in a group. In this case, not only multiple hops are collapsed for a single read and write, but also multiple reads and writes are grouped together as well.

For minimum granularity 0, the entire simulation including one or more transaction calls is collapsed into one super transaction. The single transaction of granularity 0 is a statistical summary of the entire simulation.

For simple comparison of the number of transactions recorded based on a granularity setting, the following example is considered where CPU module 101 (an initiator) performs 100 write operations to memory 102 (a target), and there are a total of 10 hops in each write operation. For granularity 10, the entire 1000 transactions are recorded. For granularity 0, only one super transaction is recorded. For granularity 5, only one super transaction per each transaction is recorded by compacting the internal hops in each transaction.

TABLE 3

| Granularity | Recorded transactions |
|---|---|
| 10 | 1000 (100 transaction * 10 hops) |
| 5 | 100 (transaction) |
| 0 | 1 |

The present statistical technique for grouping consecutive transaction calls to create a super transaction based on a granularity setting facilitates the analysis of system performance. Any combination of statistical values including throughput, utilization, or maximum, minimum, and mean latency can be recorded in the supertransactions to facilitate the system performance analysis.

From the analysis point of view, super transactions have the same format and data attributes as normal transactions supported in existing tools, for example, start time, end time, and attributes represented by <name, value> pairs. Consequently, no specific tooling or format/data conversion, no new recording API, no new database, and no new visualization tool is needed to handle super transactions in an existing analysis tool.

According to one embodiment, a transaction viewer demonstrates local system performance statistics using super transactions. The transaction viewer displays the attributes of super transactions on a time scale. Each set of transactions represented by a super transaction shows attributes of statistical data such as range and average. Other statistical attributes such as read throughput and write throughput that factor time information can be calculated and displayed in the transaction viewer as well.

With a lower granularity, a higher level of grouping may be used to represent multiple and/or a series of transactions in a single super transaction. In one embodiment, transactions with similar properties are gathered in a super transaction. For example, for a video processing module loading 16200 macro blocks of 256 bytes from memory 102, conventional transactional simulation records all 16200 read transactions of length 256 at regularly incrementing addresses. In this case, it would be sufficient to record only one super transaction that represent the 16200 read transactions with varying addresses in the same address block, with the following attributes in <name, value(s)> pairs:

<transaction count, 16200>
<opcode, 100% READ, 0% WRITE>
<address, 0x2000000 - 0x23F47FF>
<size, min 256 bytes, average 256 bytes, max 256 bytes, total 4147200 bytes>
<data, random>
<duration, min 12 ns, average 12 ns, max 12 ns>
<delay, min 10 ns, average 10.25 ns, max 40 ns>

The traffic for a block of read transactions is quite regular except that the data is random, and the delay between individual read transactions may not always be constant. When visualizing transactions in a system performance analysis, the super transaction representation is more useful than the detailed transaction records of the individual transactions.

According to one embodiment, a super transaction is recorded as a normal transaction, with several attributes in <name, value(s)> pairs. For example, a super transaction represents a summary of a set of multiple transactions in the same traffic stream with the following attributes:
  start time of the super transaction is the start time of the first transaction of the set
  end time of the super transaction is the end time of the last transaction of the set
  attributes describe the statistics on the set of transactions
  min/average/max value of each transaction attribute (when applicable)
  timing profile (e.g., duration, delay) of the transaction set
  summary counts and general statistics The construction of efficient and meaningful super transactions depends on the regularity and consistency among the individual transactions. The transactions are observed on various modules including an initiator, a target, and an interconnect module. An initiator tends to present some regular functional attributes in the transactions, but their timing varies depending on their journey to the target in the system. Some targets may provide regular response times, but several traffic streams of different characteristics may converge on the target, hence resulting in irregular transactions.

According to one embodiment, various schemes are used for configuring the level of granularity in grouping basic transactions and generating a super transaction therefrom, for example:

1) custom instrumentation of conventional TLM models by the user, to indicate a super transaction to start and end,
2) custom algorithm for specific applications (e.g., macro block identification for video transaction), and
3) automatic grouping of transactions requiring no or little input from the user.

In one embodiment, the automatic grouping algorithm employs statistical techniques to find similarities between underlying transactions and disruptions (e.g., start or end of a sequence, change in traffic shape) in the transaction stream. The automatic grouping algorithm inspects all the transactions to be collapsed and generates a super transaction. This allows for the implementation of a simpler and more intelligent grouping algorithm, however its efficiency is compromised because the grouping requires inspection of all the transactions.

Figure 3:
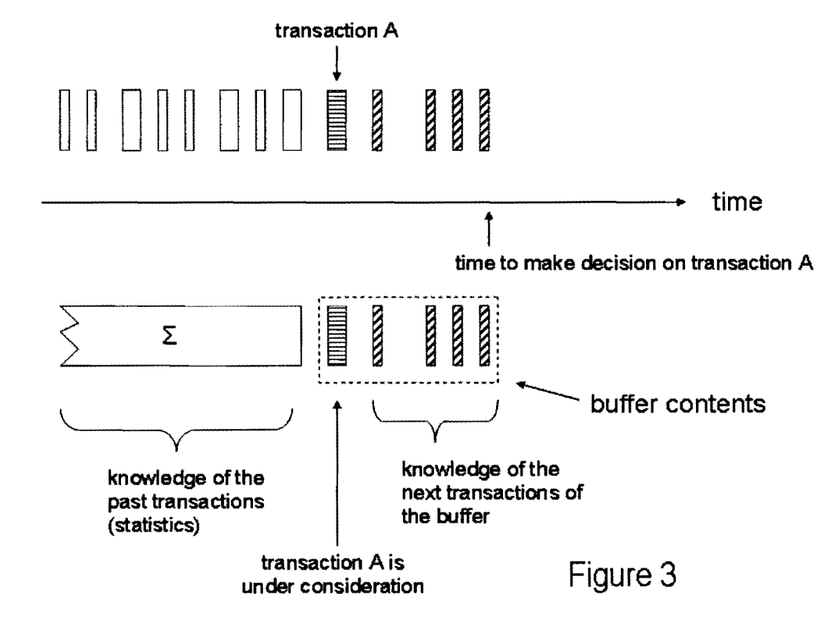
FIG. 3 illustrates an alternate embodiment which uses buffering.

According to another embodiment, an automatic grouping algorithm employs processing of the transactions on the fly. This grouping algorithm, illustrated in FIG. 3, provides efficiency and scalability. Processing transactions on the fly (e.g., Transaction A in FIG. 3) means that transactions are processed one by one, in the order of their appearance on the transaction stream. For each transaction, the algorithm must decide if it is part of the current supertransaction, or if it corresponds to the start of a new supertransactions. The algorithm can maintain statistics on the past transactions (see FIG. 3), which allows to compare the current transactions to the recent transaction history. With a pure on-the-fly algorithm, it is not possible to take into account the statistics on the next transactions (future transactions). It becomes possible if the transactions are buffered and if the decision is delayed by several transactions (also shown in FIG. 3). Then the decision can take into account the statistics on future transactions, which are stored in the buffer. That buffering increases the performance impact of the supertransaction recording, because of the resources required by the buffering.

The present grouping algorithm provides stability of grouping such that small changes from one run to another run do not completely change the grouping scheme. In addition, the present grouping algorithm also provides control of a granularity/sensitivity level to produce super transactions at various grains or levels.

In one embodiment, the automatic grouping algorithm employs moving averages and standard deviations of base transactions. The attributes of the transactions are continuously monitored, and any notable and/or significant changes of the transactions are automatically detected. The notable and/or significant change of an attribute is detected based on the relative changes or deviation from the past values, for example, the moving average of the attribute value on a predefined number of trailing transactions, or the standard deviation of the moving average. The algorithm further determines a new super transaction boundary when the deviation from the average exceeds a predefined threshold. The predefined threshold may be expressed as a multiple of the standard deviation (i.e., a sensitivity factor) of a monitored attribute.

For example, the grouping algorithm is applied with a moving average length of N transactions (typically 1000 or more) and a sensitivity factor f (typically 2.0 to 3.0). For each monitored attribute, moving average corresponding to the last N transactions and the associated standard deviation are continuously calculated. When at least one attribute exits the allowable sensitivity range, for example, the sensitivity factor f times the standard deviation, it is determined the current super transaction has ended at the previous transaction, and a new super transaction has started.

As long as the transactions are similar and stay within the sensitivity range in terms of moving average and deviation, the same super transaction is used. When the current super transaction has not yet finished, the same attributes are recorded in the current super transaction instead of starting a new super transaction. The metric for similarity or allowable sensitivity range is automatically updated over the time because it is based on the moving averages and their deviation. The grouping algorithm automatically adapts itself to many scales and use cases because the similarity metric for generating super transactions and the corresponding thresholds can vary depending on the user setting and the characteristics of transactions.

For transactions in accordance with TLM 2.0 Specification, various average values of moving attributes are computed:

1) average transaction duration: average is computed on the time values expressed in real number;
2) average inter-transaction time (average delay between transactions): average is computed on the time values expressed in real number;
3) average command attribute: 0.0 represents TLM_READ_COMMMAND, 1.0 represents TLM_WRITE_COMMAND, so that the average is the proportion of writes;
4) average response status: 0.0 represents TLM_OK_RESPONSE, 1.0 represents any other erroneous response, so that the average is the proportion of error transactions;
5) average data length: average is computed directly from the values expressed in real numbers; and
6) average address: computing the average of a set of addresses is possibly less meaningful, but the distance between addresses in a series of transactions may present interesting metric to the user.

It is noted that data and byte enable attributes are expected to take quasi-random values, thus they are excluded from the list of average values.

Different grouping algorithms may be employed to determine how to update the current moving averages and variances for a new super transaction once an over-threshold deviation is detected. In one embodiment, the current moving averages and variances are continuously updated whether or not a new super transaction starts. In this case, the following transactions are likely to continue to exceed the variance threshold, and several short super transactions will follow. The appearance of several short super transactions after detecting an over-threshold deviation indicates such a transition from one super transaction to another but provides more detailed information during the transition.

According to one embodiment, an average value $a_i$ of a sliding window of trailing length N is calculated from transaction data $x_{i-N}, x_{i-N+1} \Lambda\, x_{i-1}$ buffered in the memory by:

$$a_i = \frac{1}{N} \sum_{j=i-N+1}^{i} x_j.$$

Alternatively, the average value $a_i$ is calculated by:

$$a_i = a_{i-1} + \frac{x_i - x_{i-N}}{N}.$$

In this case, not all N transaction data needs to be stored. Instead, the average value $a_i$ is calculated from the previous average $a_{i-1}$, the current transaction data $x_i$, and the Nth previous transaction data $x_{i-N}$.

In another embodiment, an exponentially decreasing average $a_i$ is calculated by:

$$a_i = k \sum_{j=0}^{i} (1-k)^{i-j} x_j,$$

where k is a weighting factor, 0<k<1. Alternatively, the exponentially decreasing average $a_i$ is calculated from a recursive formula:

$$a_0 = kx_0,$$

$$a_i = kx_i + (1-k)a_{i-1}.$$

The exponentially decreasing average $a_i$ does not require any individual transaction data in memory. An equivalent of the trailing length N can be configured by appropriately setting the weighting factor k.

The exponentially decreasing average is particularly advantageous because it is suitable for a very long trailing length N (by using a small weighting factor k). The changes in the average and deviation are smoother and there is no abrupt change in the average. When a new super transaction starts, previously accumulated averages and variances are simply scaled down by a larger, configurable weighting factor k'≥k. In a case when a new supertransaction starts, instead of using the normal k factor, we use an "overweighting factor" k', which is slightly larger than k. Such an overweighting factor downgrades the history a little bit faster. k' is preferably used just as k: Note that there is no strict rule to determine k', except that 1<k'<k. k' can be entered by the user to fine-tune the supertransactions appearance.

According to one embodiment, the grouping algorithm calculates an exponential average with an approximated variance. The recorder computes the exponential average recursively, as described previously. However, it would be impractical to compute and store all the previous N square deviations. Therefore, instead of computing exact variance $S_i$:

$$S_i = k \sum_{j=0}^{i} (1-k)^{i-j} (x_j - a_i)^2,$$

an approximated variance $S'_i$ is computed by:

$$S'_i = k \sum_{j=0}^{i} (1-k)^{i-j} (x_j - a_j)^2.$$

The approximate variance $S'_i$ can be easily computed by the following recursion formula:

$$S'_i = k(x_i - a_i)^2 + (1-k) S'_{i-1}.$$

With this approximate variance $S'_i$, the criterion for terminating the previous super transaction and starting a new super transaction is unchanged because the transition occurs when the square deviation of one attribute exceeds the square of the sensitivity factor $f^2$ times approximate variance $S'_i$. The criterion for terminating a super transaction based on the approximate variance $S'_i$ is expressed by:

$$(x_i - a_i)^2 > f^2 S'_i.$$

According to one embodiment, the present grouping algorithm expands the time window for generating super transactions by considering a finite number of transactions occurred after the current time. The inclusion of future transactions is equivalent to delaying the super transaction decision and to applying a few transactions back. Similar results can be obtained by utilizing a higher degree of moments than the standard deviations used above.

A method and system for controlling granularity of transaction recording and visualizing system performance in a discrete simulation environment is disclosed. Although various embodiments have been described with respect to specific examples and subsystems, it will be apparent to those of ordinary skill in the art that the concepts disclosed herein are not limited to these specific examples or subsystems but extends to other embodiments as well. Included within the scope of these concepts are all of these other embodiments as specified in the claims that follow.

We claim:

1. A computer-implemented method for controlling granularity of transaction recording, comprising:
    simulating a model of a circuit design in a simulation system for a period of time, a plurality of transactions occurring during the period of time and each transaction of the plurality of transactions being represented with an attribute;
    monitoring a statistical value of the attribute of the plurality of transactions;
    determining a granularity setting comprising a sensitivity factor;
    determining a deviation band for the statistical value from the sensitivity factor;
    during simulation of the model of the circuit design, grouping a first group of consecutive transactions of the plurality of transactions into a first super transaction based on the granularity setting, wherein the first super transaction comprises the statistical value of the attribute for the first group of consecutive transactions;
    ending the first super transaction when the statistical value of the attribute exits the deviation band; and
    recording the first super transaction in a memory device.

2. The computer-implemented method of claim 1 further comprising:
    changing the granularity setting with a second sensitivity factor;
    grouping a second group of consecutive transactions of the plurality of transactions into a second super transaction based on the changed granularity setting, the second super transaction being represented with the statistical value of the attribute for the second group of transactions; and
    ending the second super transaction when the statistical value of the attribute for the second group of transactions exits the deviation band; and
    recording the second super transaction.

3. The computer-implemented method of claim 2 further comprising:

visualizing the first super transaction and the second super transaction; and analyzing performance of the model.

4. The computer-implemented method of claim 1, wherein the attribute comprises a combination of a transaction duration, an inter-transaction time, a command, a response status, a data length, and an address.

5. The computer-implemented method of claim 4, wherein the statistical value of the attribute comprises a moving average of the attribute of the plurality of transactions and the associated standard deviation.

6. The computer-implemented method of claim 5, wherein at each transaction the moving average is calculated from the average of previous N transactions and the current transaction.

7. The computer-implemented method of claim 5, wherein the moving average is a exponentially decreasing average calculated by a recursive formula with a weighting factor, the weighting factor determining the contribution of the current transaction with respect to previous N transactions.

8. The computer-implemented method of claim 5, wherein the first super transaction ends when the moving average exits the deviation band, the deviation band being determined by the sensitivity factor times the standard deviation.

9. The computer-implemented method of claim 1, wherein the attribute comprises a transaction count, opcode, address, size, data, and duration of corresponding transaction, and a delay between each transaction.

10. The computer-implemented method of claim 1, wherein the granularity setting is determined on a sliding granularity scale from a minimum value to a maximum value, at the minimum value the first super transaction comprises only one transaction.

11. The computer-implemented method of claim 1, wherein the model is simulated according to SystemC transaction-level modeling (TLM) Specification 2.0.

12. The computer-implemented method of claim 11, wherein the attribute comprises payload data, and wherein the plurality of transactions comprises a blocking transport call, a forward non-blocking transport call, and a backward non-blocking transport call.

13. A non-transitory computer-readable medium having stored thereon a plurality of instructions for controlling granularity of transaction recording, said plurality of instructions when executed by a computer, cause said computer to perform:

simulating a model of a circuit design in a simulation system for a period of time, a plurality of transactions occurring during the period of time and each transaction of the plurality of transactions being represented with an attribute;

monitoring a statistical value of the attribute of the plurality of transactions;

determining a granularity setting comprising a sensitivity factor;

determining a deviation band for the statistical value from the sensitivity factor;

during simulation of the model of the circuit design, grouping a first group of consecutive transactions of the plurality of transactions into a first super transaction based on the granularity setting, wherein the first super transaction comprises the statistical value of the attribute for the first group of consecutive transactions; and ending the first super transaction when the statistical value of the attribute exits the deviation band; and recording the first super transaction in a memory device.

14. The non-transitory computer-readable medium of claim 13 having stored thereon-additional instructions, said additional instructions when executed by a computer, cause said computer to further perform:

changing the granularity setting with a second sensitivity factor;

grouping a second group of consecutive transactions of the plurality of transactions into a second super transaction based on the changed granularity setting, the second super transaction being represented with the statistical value of the attribute for the second group of transactions, and ending the second super transaction when the statistical value of the attribute for the second group of transactions exits the deviation band; and recording the second super transaction.

15. The non-transitory computer-readable medium of claim 14 having stored thereon-additional instructions, said additional instructions when executed by a computer, cause said computer to further perform:

visualizing the first super transaction and the second super transaction; and analyzing performance of the model.

16. The non-transitory computer-readable medium of claim 13, wherein the attribute comprises a combination of a transaction duration, an inter-transaction time, a command, a response status, a data length, and an address.

17. The non-transitory computer-readable medium of claim 16, wherein the statistical values of the attribute comprises a moving average of the attribute of the plurality of transactions and the associated standard deviation.

18. The non-transitory computer-readable medium of claim 17, wherein at each transaction the moving average is calculated from the average of previous N transactions and the current transaction.

19. The non-transitory computer-readable medium of claim 17, wherein the moving average is a exponentially decreasing average calculated by a recursive formula with a weighting factor, the weighting factor determining the contribution of the current transaction with respect to previous N transactions.

20. The non-transitory computer-readable medium of claim 17, wherein the first super transaction ends when the moving average exits the deviation band, the deviation hand being determined by the sensitivity factor times the standard deviation.

21. The non-transitory computer-readable medium of claim 13, wherein the attribute comprises a transaction count, opcode, address, size, data, and duration of corresponding transaction, and a delay between each transaction.

22. The non-transitory computer-readable medium of claim 13, wherein the granularity setting is determined on a sliding granularity scale from a minimum value to a maximum value, at the minimum value the first super transaction comprises only one transaction.

23. The non-transitory computer-readable medium of claim 13, wherein the model is simulated according to SystemC transaction-level modeling (TLM) Specification 2.0.

24. The non-transitory computer-readable medium of claim 22, wherein the attribute comprises payload data, and wherein the plurality of transactions comprises a blocking transport call, a forward non-blocking transport call, and a backward non-blocking transport call.

25. A discrete event simulation system comprising: a model of a circuit design simulated for a period of time; and a memory comprising:

a first portion for storing a plurality of transactions that occurred during the period of:
time and an attribute representing each transaction of the plurality of transactions;
a second portion for monitoring a statistical value of the attribute of the plurality of transactions;
a third portion for storing a granularity setting that is programmably configurable by a user or automatically set by the simulation system;
a fourth portion for storing a deviation band for the statistical value, wherein the statistical value is determined from the sensitivity factor; and
a fifth portion storing a first super transaction during simulation of the model of the circuit design,
wherein one or more consecutive transactions of the plurality of transactions are grouped into the first super transaction based on the granularity setting,
wherein the first super transaction ends when the statistical value exits the deviation band, and
wherein the first super transaction comprises the statistical value of the attribute for the one or more consecutive transactions.

* * * * *